United States Patent [19]
Park et al.

[11] Patent Number: 5,780,115
[45] Date of Patent: Jul. 14, 1998

[54] METHODS FOR FABRICATING ELECTRODE STRUCTURES INCLUDING OXYGEN AND NITROGEN PLASMA TREATMENTS

[75] Inventors: In-sung Park, Seoul; Byoung-taek Lee, Kyungki-do, both of Rep. of Korea

[73] Assignee: Samsung Electronics Co., Ltd., Suwon, Rep. of Korea

[21] Appl. No.: 806,145

[22] Filed: Feb. 25, 1997

[30] Foreign Application Priority Data

Feb. 29, 1996 [KR] Rep. of Korea .................. 1996-5311

[51] Int. Cl.$^6$ .............................. H05H 1/00; B05D 3/06
[52] U.S. Cl. ................ 427/539; 427/535; 427/81; 427/255.7; 427/404
[58] Field of Search .................... 427/81, 535, 539, 427/255.7, 404; 438/239

[56] References Cited

U.S. PATENT DOCUMENTS 5,508,221  4/1996  Kamiyama ........................... 437/60

FOREIGN PATENT DOCUMENTS 8-069972  3/1996  Japan.

*Primary Examiner*—Roy V. King
*Attorney, Agent, or Firm*—Myers Bigel Sibley & Sajovec

[57] ABSTRACT

A method for fabricating an integrated circuit capacitor includes the steps of forming a first electrode on a microelectronic substrate, and plasma treating the first electrode with a with a plasma of a gas including nitrogen and oxygen. A dielectric film is formed on the plasma treated first electrode opposite the microelectronic substrate. A second electrode is formed on the dielectric film opposite the plasma treated first electrode.

45 Claims, 3 Drawing Sheets

(A)

(B)

METHODS FOR FABRICATING ELECTRODE STRUCTURES INCLUDING OXYGEN AND NITROGEN PLASMA TREATMENTS

FIELD OF THE INVENTION

The present invention relates to the field of integrated circuits and more particularly to methods for fabricating integrated circuit electrode structures.

Background of the Invention

As memory devices become more highly integrated, the size of the individual memory cells decreases and operating voltages decrease. In a dynamic random access memory (DRAM), however, a memory cell capacitor should provide a predetermined charge despite the reductions in size and operating voltages to ensure accurate data retrieval. When the capacitor is unable to provide a sufficient charge, problems such as an increased soft error rate and a shortened refresh time may result.

The charge (Q) of a capacitor is dependent on its operating voltage (V) and capacitance (C). Because the operating voltage of a dynamic random access memory is generally reduced as the integration density is increased, it may be necessary to increase the capacitance of the memory cell capacitor in order to maintain a sufficient charge for reliable memory operations. Accordingly, there is a need to increase the capacitance of DRAM memory cell capacitors even as the space available for these capacitors decreases.

The capacitance (C) of a capacitor can be determined using the equation listed below:

$$C = \frac{\epsilon_0 \epsilon A}{d}.$$

In this equation, $\epsilon_0$ represents permittivity in a vacuum, $\epsilon$ represents the dielectric constant of the dielectric film of the capacitor, A denotes the effective area of the capacitor electrodes, and d denotes the effective thickness of the dielectric film.

According to this equation, the capacitance (C) is directly proportional to the dielectric constant of the dielectric film and the effective area of the electrode, and the capacitance is inversely proportional to the thickness of the dielectric film. Three avenues are thus available when increasing the capacitance of a capacitor: (1) increase the area of the electrodes; (2) reduce the thickness of the dielectric film; and (3) use a material for the dielectric film having an increased permittivity.

When reducing the thickness of the dielectric film, a natural oxide may form on the surface of an electrode adjacent the dielectric film thus increasing the effective thickness of the dielectric film. Accordingly, it may be desirable to remove this natural oxide to further reduce the thickness of the dielectric film.

In particular, when using a capacitor having a tantalum oxide ($Ta_2O_5$) dielectric film with a dielectric constant between 22 and 25, a natural oxide film may grow on the interface between a polysilicon lower electrode and the tantalum oxide film. It may thus be difficult to obtain an equivalent oxide thickness of less than 35 Å. Because the natural oxide film may grow with nonuniformities, the leakage current density may also increase.

The equivalent oxide thickness may be reduced by removing or nitriding any natural oxide film on the lower electrode of a capacitor. Methods for removing or nitriding a natural oxide film include performing a hydrofluoric acid (HF) solution treatment on the lower electrode, performing a rapid thermal nitridation (RTN), and performing a tube nitriding treatment. The use of hydrofluoric acid (HF), however, may result in the generation of prominences and depressions on the surface of the lower electrode thus making it difficult to obtain a flat surface. Accordingly, a dielectric film formed on the lower electrode may have nonuniformities so that a voltage applied between the upper and lower electrodes is concentrated at thin portions of the dielectric film thus increasing leakage currents.

When using a nitriding treatment to remove a natural oxide film from the lower electrode, the temperature may preferably be restricted to 900° C. or less to reduce changes in electrical characteristics of transistors and/or other circuits. At this temperature, however, the natural oxide film may not be completely nitrided to an $Si_3N_4$ and may include SiON portions. SiON has a low permittivity compared with that of nitride, thus reducing capacitance.

In an alternate approach, it has been suggested to preprocess the lower electrode with plasma $NH_3$ (hereinafter referred to as "p—$NH_3$") before the dielectric film is formed on the lower electrode. This technique may reduce leakage currents.

Notwithstanding the above mentioned methods, however, there continues to exist a need in the art for improved methods for fabricating integrated circuit capacitors, and in particular, integrated circuit capacitors for dynamic random access memory devices.

Summary of the Invention

It is therefor an object of the present invention to provide improved methods for fabricating integrated circuit capacitor structures.

It is another object of the present invention to provide methods for fabricating integrated circuit capacitors having increased capacitance.

It is yet another object of the present invention to provide methods for fabricating integrated circuit capacitors having reduced leakage currents.

These and other objects are provided according to the present invention by methods including the steps of forming a first electrode on a microelectronic substrate, and plasma treating the first electrode with a plasma of a gas including nitrogen and oxygen. A dielectric film is formed on the plasma treated first electrode opposite the microelectronic substrate, and a second electrode is formed on the dielectric film opposite the plasma treated first electrode. The plasma treatment with a gas including nitrogen and oxygen reduces the formation of oxides between the first electrode and the dielectric film. Accordingly, the capacitance of the capacitor can be increased without increasing the size of the capacitor.

The step of plasma treating the first electrode can include sequentially providing a plasma of a gas including nitrogen and a plasma of a gas including oxygen. For example, the gas including nitrogen can be $NH_3$, $N_2O$, or $N_2$, and the gas including oxygen can be $N_2O$, $O_2$, or a gas including a hydroxyl (—OH) group. Alternately, a plasma of a gas such as $N_2O$ including both nitrogen and oxygen simultaneously can be provided.

The plasma treating step can be performed at a plasma output power in the range of 10 W to 50 W, for a time in the range of 5 seconds to 500 seconds, at a pressure in the range of 100 mTorr to 50 Torr, and at a temperature in the range of 200° C. to 500° C. The dielectric film can be formed from a layer of silicon nitride, silicon oxide, $Ta_2O_5$, $TiO_2$, yttrium oxide, vanadium oxide, niobium oxide, or silicon oxide, and the first electrode can be formed from a layer of tantalum, titanium, platinum, molybdenum, tantalum nitride, titanium nitride, and molybdenum nitride. In addition, the second electrode can be formed from a layer of polysilicon, tantalum, titanium, platinum, molybdenum, tantalum nitride, titanium nitride, and molybdenum nitride.

Accordingly, the methods of the present invention can be used to provide integrated circuit capacitors with increased capacitance. In particular, these methods can be used to provide memory cell capacitors for dynamic random access memory devices which maintain a sufficient capacitance despite increases in integration densities. Accordingly, soft error rates can be reduced, and refresh times can be shortened.

DETAILED DESCRIPTION

Figure 1:
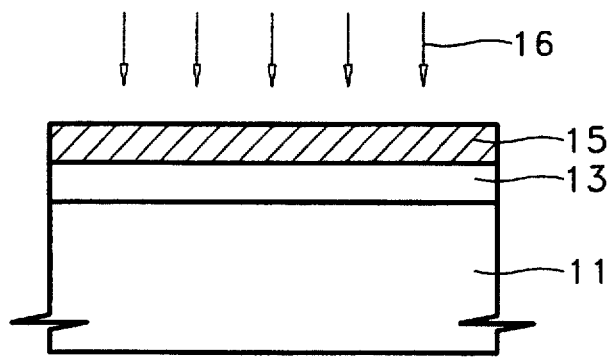
FIGS. 1 to 3 are cross sectional views illustrating steps of a method for fabricating an integrated circuit capacitor according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
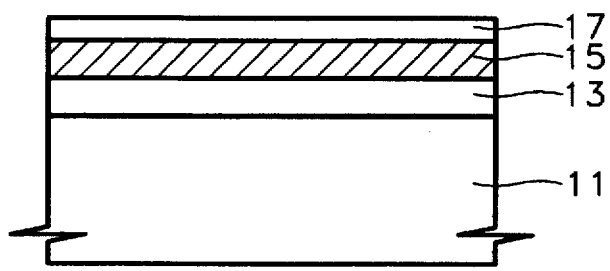
Figure 3:
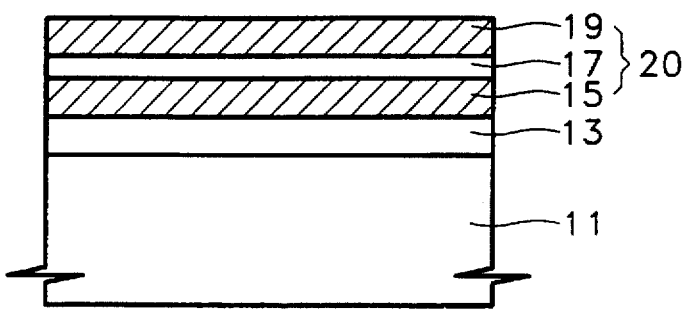

FIGS. 1–3 illustrate steps of a method for fabricating an integrated circuit capacitor according to the present invention. In particular, FIG. 1 illustrates the formation of the lower electrode 15 of the capacitor. As shown, an insulating layer 13 covers the semiconductor substrate 11, and the lower electrode 15 is formed on the insulating layer 13. This lower electrode can be formed from a layer of polysilicon, tantalum (Ta), titanium (Ti), platinum (Pt), molybdenum (Mo), tantalum (Ta) nitride, titanium (Ti) nitride or molybdenum (Mo) nitride. Alternately, the lower electrode can be formed from two or more layers of the above mentioned materials.

The exposed surface of the lower electrode 15 is then preprocessed to reduce any natural oxide which may form thereon and to reduce defects on the lower electrode. In particular, the lower electrode 15 is treated with a plasma 16 of a gas or gasses including nitrogen and oxygen. The gas including nitrogen and the gas including oxygen can be provided sequentially or simultaneously. The gas including nitrogen can be $NH_3$, $N_2O$, or $N_2$, and the gas including oxygen can be $N_2O$, $O_2$, or a gas including a hydroxyl (—OH) group. For example, the lower electrode 15 can be preprocessed using a plasma $NH_3$ (p—$NH_3$) treatment and a plasma $O_2$ (p—$O_2$) treatment which are performed sequentially or simultaneously. Alternately, a single plasma $N_2O$ (p—$N_2O$) treatment can be used. These plasma treatments can be performed using a plasma output power in the range of 10 W to 50 W, for a period of time in the range of 5 seconds to 500 seconds, at a pressure in the range of 100 mTorr to 50 Torr, and at a temperature in the range of 200° C. to 500° C.

The step of forming the dielectric film 17 on the lower electrode 15 after the plasma treatment 16 is shown in FIG. 2. The dielectric film can be formed from a layer of silicon nitride, silicon oxide, tantalum oxide ($Ta_2O_5$), or titanium oxide ($TiO_2$), and the dielectric film can have a thickness of approximately 90 Å. Alternatively, the dielectric film 17 can be formed from a layer of yttrium (Y) oxide, a vanadium (V) oxide, niobium (Nb) oxide, or silicon (Si) oxide. Alternately, the dielectric film can be formed from two or more layers of the above mentioned materials. The dielectric film 17 can then be annealed in a first order in an oxygen ($O_2$) atmosphere at approximately 300° C. for about 15 minutes, and then annealed in a second order in the oxygen ($O_2$) atmosphere at approximately 800° C. for about 30 minutes.

The step of forming an upper electrode 19 is shown in FIG. 3. The upper electrode 19 can be formed from a layer of polysilicon, tantalum (Ta), titanium (Ti), platinum (Pt), molybdenum (Mo), tantalum (Ta) nitride, titanium (Ti) nitride, or molybdenum (Mo) nitride. Alternately, the upper electrode 19 can be formed from two or more layers of the above mentioned materials. The resulting structure can then be subjected to a first anneal at a temperature of approximately 750° C. for about 30 minutes, and then a second anneal at a temperature approximately 830° C. for about 30 minutes to complete the capacitor 20.

Figure 4:
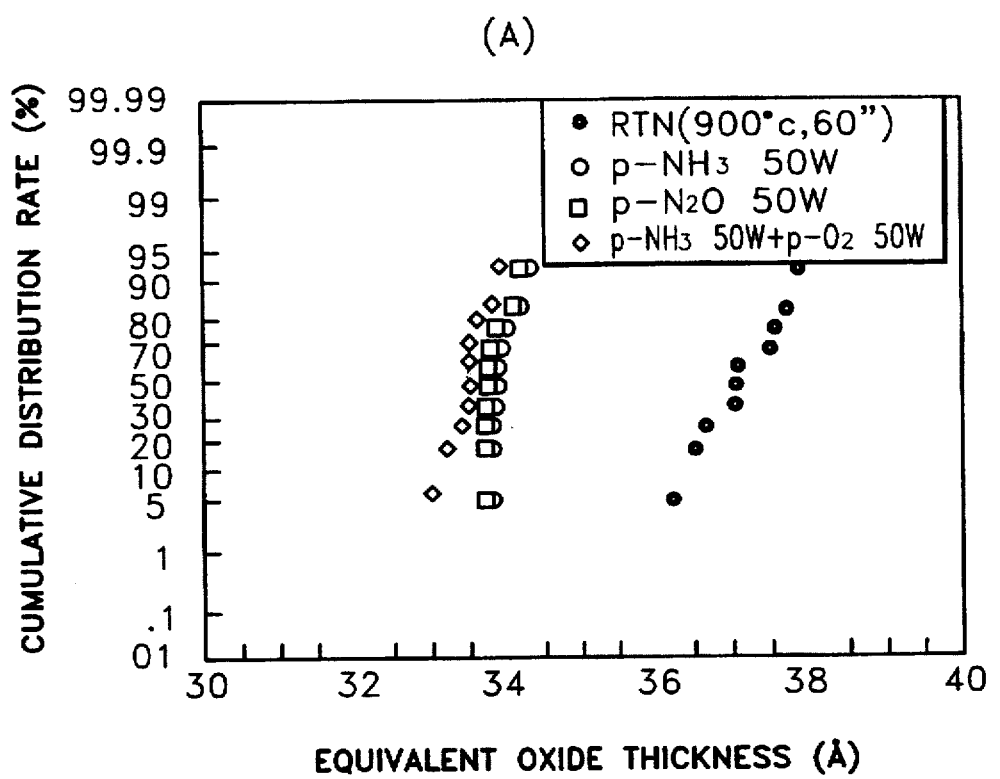
FIG. 4(A) and (B) are graphs illustrating cumulative distribution rates of an equivalent oxide thickness and leakage current densities with respect to capacitors formed according to methods of the present invention and the prior art.
Figure 4:
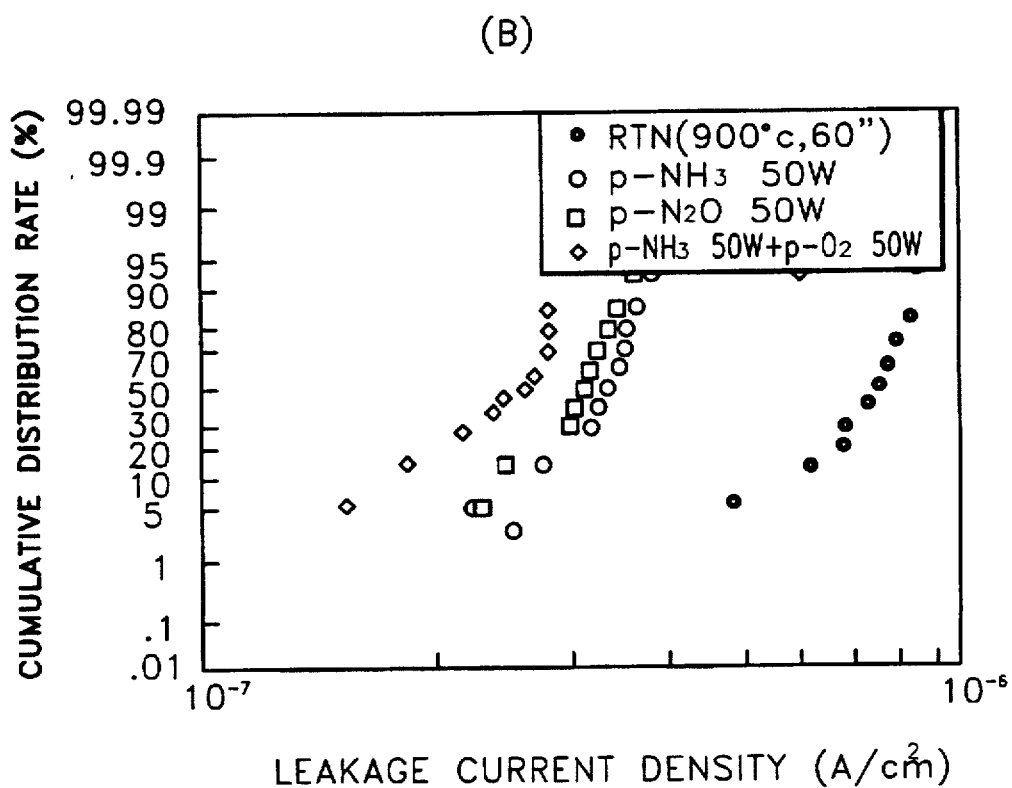

Examples of capacitors formed according to the methods of the present invention will now be discussed with reference to FIG. 4(A) and (B). FIG. 4(A) and (B) are graphs respectively illustrating cumulative distribution rates of equivalent oxide thickness and leakage current densities when the lower electrode is preprocessed using the following treatments: a rapid thermal nitridation (RTN) treatment (●); a plasma $NH_3$ (p—$NH_3$) treatment (○); a plasma $N_2O$ (p—$N_2O$) treatment (◻); and a plasma $NH_3$ (p—$NH_3$)+ plasma oxygen (p—$O_2$) treatment (◇).

When a plasma treatment using a gas containing nitrogen and oxygen is used to preprocess the lower electrode according to the present invention, improved electrical characteristics can be obtained using a dielectric film 17 having a relatively thin equivalent oxide thickness. In particular, the use of the p—$N_2O$ treatment or the p—$NH_3$+p—$O_2$ treatment according to the present invention can produce improved electrical characteristics when compared with the use of the RTN treatment or the p—$NH_3$(○) treatment.

Figure 5:
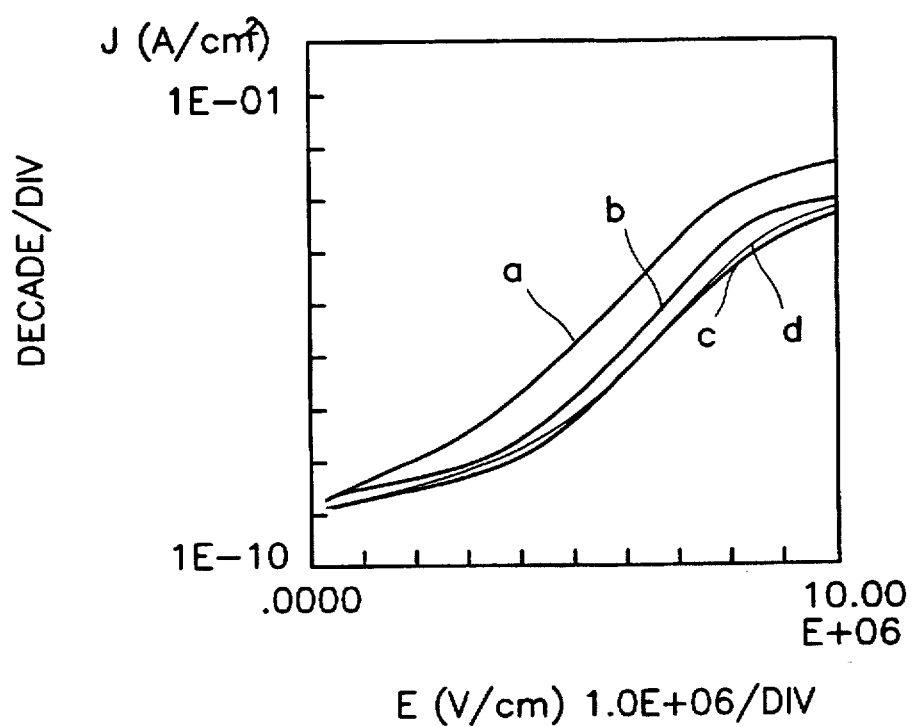
FIG. 5 is a graph illustrating leakage current densities for capacitors formed according to methods of the present invention and the prior art.

FIG. 5 is a graph illustrating results which can be obtained by measuring a leakage current generated when an electrical bias is applied across the electrodes of capacitors formed using the following treatments on the lower electrode before forming the dielectric film 17: the RTN treatment (a); the p—$NH_3$ treatment (b); the p—$N_2O$ treatment (c); and the p—$NH_3$+p—$O_2$ treatment (d). As shown in FIG. 5, when plasma treatments using a gas containing nitrogen and oxygen are performed according to the present invention, improved leakage current characteristics can be obtained. In particular, the plasma treatments using p—$N_2O$ and p—$NH_3$+p—$O_2$ result in capacitors with lower leakage currents when compared to capacitors formed using the conventional RTN and p—$NH_3$ treatments.

As described above, the fabrication of a capacitor for an integrated circuit device can include treating the surface of the lower electrode with a plasma of a gas including nitrogen and oxygen. The formation of an oxide film at the interface between the lower electrode and the dielectric film can thus be reduced, and the electrical characteristics of a capacitor thus formed can be improved even when using a dielectric film with a relatively thin equivalent oxide film.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for fabricating an integrated circuit capacitor, said method comprising the steps of:
   forming a first electrode on a microelectronic substrate;
   plasma treating said first electrode with a plasma of a gas including nitrogen and oxygen;
   forming a dielectric film on said plasma treated first electrode opposite said microelectronic substrate; and
   forming a second electrode on said dielectric film opposite said plasma treated first electrode.

2. A method according to claim 1 wherein said step of plasma treating said first electrode comprises providing a plasma of a gas simultaneously including nitrogen and oxygen.

3. A method according to claim 2 wherein said gas including nitrogen and oxygen comprises $N_2O$.

4. A method according to claim 2 wherein said gas including nitrogen and oxygen comprises $NH_3$ and $O_2$.

5. A method according to claim 1 wherein said gas including nitrogen and oxygen includes a gas selected from the group consisting of $NH_3$, $N_2O$, and $N_2$.

6. A method according to claim 1 wherein said gas including nitrogen and oxygen includes a gas selected from the group consisting of $N_2O$, $O_2$, and a gas including a hydroxyl (—OH) group.

7. A method according to claim 1 wherein said plasma treating step is performed at a plasma output power in the range of 10 W to 50 W.

8. A method according to claim 1 wherein said plasma treating step is performed for a period of time in the range of 5 seconds to 500 seconds.

9. A method according to claim 1 wherein said plasma treating step is performed at a pressure in the range of 100 mTorr to 50 Torr.

10. A method according to claim 1 wherein said plasma treating step is performed at a temperature in the range of 200° C. to 500° C.

11. A method according to claim 1 wherein said dielectric film includes a layer formed from a material selected from the group consisting of silicon nitride, $Ta_2O_5$, $TiO_2$, yttrium oxide, vanadium oxide, niobium oxide, and silicon oxide.

12. A method according to claim 1 wherein said first electrode is formed from a layer of a material selected from the group consisting of polysilicon, tantalum, titanium, platinum, molybdenum, tantalum nitride, titanium nitride, and molybdenum nitride.

13. A method according to claim 1 wherein said second electrode is formed from a layer of a material selected from the group consisting of polysilicon, tantalum, titanium, platinum, molybdenum, tantalum nitride, titanium nitride, and molybdenum nitride.

14. A method according to claim 1 wherein said plasma of a gas including nitrogen and oxygen comprises a plasma of a compound comprising both nitrogen and oxygen.

15. A method according to claim 1 wherein said plasma of a gas including nitrogen and oxygen comprises a plasma including a first compound comprising nitrogen and a second compound comprising oxygen.

16. A method according to claim 15 wherein said plasma includes said first and second compounds at the same time.

17. A method according to claim 15 wherein said plasma includes said first compound and not said second compound during a first period of time and wherein said plasma includes said second compound and not said first compound during a second time period.

18. A method for fabricating an integrated circuit capacitor, said method comprising the steps of:
   forming a first electrode on a microelectronic substrate;
   plasma treating said first electrode wherein said step of plasma treating said first electrode comprises sequentially providing a plasma of a gas including nitrogen and a plasma of a gas including oxygen;
   forming a dielectric film on said plasma treated first electrode opposite said microelectronic substrate; and
   forming a second electrode on said dielectric film opposite said plasma treated first electrode.

19. A method for fabricating an integrated circuit electrode structure, said method comprising the step of:
   forming an electrode on a microelectronic substrate; and
   plasma treating said electrode with a plasma of a gas including nitrogen and oxygen.

20. A method according to claim 19 wherein said step of plasma treating said electrode comprises providing a plasma of a gas simultaneously including nitrogen and oxygen.

21. A method according to claim 20 wherein said gas including nitrogen and oxygen comprises $N_2O$.

22. A method according to claim 20 wherein said gas including nitrogen and oxygen comprises $NH_3$ and $O_2$.

23. A method according to claim 19 wherein said gas including nitrogen and oxygen includes a gas selected from the group consisting of $NH_3$, $N_2O$, and $N_2$.

24. A method according to claim 19 wherein said gas including nitrogen and oxygen includes a gas selected from the group consisting of $N_2O$, $O_2$, and a gas including a hydroxyl (—OH) group.

25. A method according to claim 19 wherein said plasma treating step is performed at a plasma output power in the range of 10 W to 50 W.

26. A method according to claim 19 wherein said plasma treating step is performed for a period of time in the range of 5 seconds to 500 seconds.

27. A method according to claim 19 wherein said plasma treating step is performed at a pressure in the range of 100 mTorr to 50 Torr.

28. A method according to claim 19 wherein said said plasma treating step is performed at a pressure in in the range of 200° C. to 500° C.

29. A method according to claim 19 further comprising the steps of:
   forming a dielectric film on said plasma treated electrode opposite said microelectronic substrate; and
   forming a second electrode on said dielectric film opposite said plasma treated first electrode.

30. A method according to claim 29 wherein said dielectric film includes a layer formed from a material selected from the group consisting of silicon nitride, $Ta_2O_5$, $TiO_2$, yttrium oxide, vanadium oxide, niobium oxide, niobium oxide, and silicon oxide.

31. A method according to claim 29 wherein said second electrode is formed from a layer of a material selected from the group consisting of polysilicon, tantalum, titanium, platinum, molybdenum, tantalum nitride, titanium nitride, and molybdenum nitride.

32. A method according to claim 19 wherein said electrode is formed from a layer of a material selected from the group consisting of polysilicon, tantalum, titanium, platinum, molybdenum, tantalum nitride, titanium nitride, and molybdenum nitride.

33. A method according to claim 19 wherein said plasma of a gas including nitrogen and oxygen comprises a plasma of a compound comprising both nitrogen and oxygen.

34. A method according to claim 19 wherein said plasma of a gas including nitrogen and oxygen comprises a plasma including a first compound comprising nitrogen and a second compound comprising oxygen.

35. A method according to claim 34 wherein said plasma includes said first and second compounds at the same time.

36. A method according to claim 34 wherein said plasma includes said first compound and not said second compound during a first period of time and wherein said plasma includes said second compound and not said first compound during a second time period.

37. A method for fabricating an integrated circuit electrode structure, said method comprising the steps of:

forming an electrode on a microelectronic substrate; and plasma treating said electrode wherein said step of plasma treating said electrode comprises sequentially providing a plasma of a gas including nitrogen and a plasma of a gas including oxygen.

38. A method for fabricating an integrated circuit capacitor, said method comprising the steps of:

forming a first electrode on a microelectronic substrate;

plasma treating said first electrode with a plasma of a compound comprising both nitrogen and oxygen;

forming a dielectric layer on said plasma treated first electrode opposite said microelectronic substrate; and forming a second electrode on said dielectric film opposite said plasma treated first electrode.

39. A method according to claim 38 wherein said compound including both nitrogen and oxygen comprises $N_2O$.

40. A method according to claim 38 wherein said first electrode is formed from a layer of a material chosen from the group consisting of polysilicon, tantalum, titanium, platinum, molybdenum, tantalum nitride, titanium nitride, and molybdenum nitride.

41. A method for fabricating an integrated circuit capacitor, said method comprising the steps of:

forming a first electrode on a microelectronic substrate;

plasma treating said first electrode with a plasma including a first compound comprising nitrogen and a second compound comprising oxygen;

forming a dielectric layer on said plasma treated first electrode opposite said microelectronic substrate; and forming a second electrode on said dielectric film opposite said plasma treated first electrode.

42. A method according to claim 41 wherein said first compound comprises a compound selected from the group consisting of $NH_3$, $N_2$, and $N_2O$, and wherein said second compound comprises a compound selected from the group consisting of $N_2O$, $O_2$, and a gas including a hydroxyl (—OH) group.

43. A method according to claim 41 wherein said first electrode is formed from a layer of a material chosen from the group consisting of polysilicon, tantalum, titanium, platinum, molybdenum, tantalum nitride, titanium nitride, and molybdenum nitride.

44. A method according to claim 41 wherein said plasma includes said first and second compounds at the same time.

45. A method according to claim 41 wherein said plasma includes said first compound and not said second compound during a first period of time and wherein said plasma includes said second compound and not said first compound during a second time period.

* * * * *